(12) United States Patent
Novak

(10) Patent No.: US 6,753,481 B2
(45) Date of Patent: Jun. 22, 2004

(54) PRINTED CIRCUIT BOARD EMPLOYING LOSSY POWER DISTRIBUTION NETWORK TO REDUCE POWER PLANE RESONANCES

(75) Inventor: Istvan Novak, Maynard, MA (US)

(73) Assignee: Sun Microsystems, Inc., Santa Clara, CA (US)

(*) Notice: Subject to any disclaimer, the term of this patent is extended or adjusted under 35 U.S.C. 154(b) by 15 days.

(21) Appl. No.: 10/227,139

(22) Filed: Aug. 23, 2002

(65) Prior Publication Data

US 2003/0015344 A1 Jan. 23, 2003

Related U.S. Application Data

(62) Division of application No. 09/447,513, filed on Nov. 23, 1999, now Pat. No. 6,441,313.

(51) Int. Cl.[7] ............................. H05K 1/03; H05K 1/00
(52) U.S. Cl. ..................... 174/255; 174/255; 174/262; 361/792; 361/795
(58) Field of Search ................................ 174/255, 260, 174/262, 261, 253; 361/760, 792, 793, 794, 795, 780

(56) References Cited

U.S. PATENT DOCUMENTS

| | | | | |
|---|---|---|---|---|
| 3,680,005 A | * | 7/1972 | Jorgensen et al. | .......... 333/134 |
| 4,494,172 A | | 1/1985 | Leary et al. | |
| 4,553,111 A | | 11/1985 | Barrow | |
| 4,675,789 A | | 6/1987 | Kuwabara et al. | |
| 4,736,521 A | * | 4/1988 | Dohya | .......... 29/830 |
| 4,775,573 A | | 10/1988 | Turek | |
| 4,996,097 A | | 2/1991 | Fischer | |
| 5,010,641 A | * | 4/1991 | Sisler | .......... 29/830 |
| 5,036,167 A | * | 7/1991 | Kasai | .......... 174/256 |
| 5,079,069 A | | 1/1992 | Howard et al. | |
| 5,110,664 A | * | 5/1992 | Nakanishi et al. | .......... 428/195 |
| 5,155,655 A | | 10/1992 | Howard et al. | |
| 5,161,086 A | | 11/1992 | Howard et al. | |

(List continued on next page.)

FOREIGN PATENT DOCUMENTS

| | | |
|---|---|---|
| DE | 198 02 243 | 7/1999 |
| EP | 0 451 541 | 10/1991 |
| EP | 0 813 355 | 12/1997 |
| EP | 0 906 004 | 3/1999 |

OTHER PUBLICATIONS

Pannala et al., "Contribution of Resonance to Ground Bounce in Lossy Thin Film Planes," © 1998 IEEE, pp. 185–188.

Libous, "Characterization of Flip–Chip CMOS ASIC Simultaneous Switching Noise on Multilayer Organi and Ceramic BGA/CGA Packages," © 1998 IEEE, pp. 191–194.

Chen et al., "Norton Equivalent Modeling of Microprocessor Core Noise from Measurements," © 1998 IEEE, pp. 195–198.

Kim et al., "Rejection of SSN Coupling in Multilayer PCB using a Conductive Layer," © 1998 IEEE, pp. 199–202.

Becker et al., "Modeling, Simulation, and Measurement of Mid–Frequency Simultaneous Switching Noise in Computer Systems," IEEE Transactions on Components, Packaging, and Manufacturing Technology–Part B., vol. 21, No. 2, May 1998, pp. 157–163.

(List continued on next page.)

Primary Examiner—Evan Pert
Assistant Examiner—I B Patel
(74) Attorney, Agent, or Firm—Meyertons Hood Kivlin Kowart & Goetzel, P.C.; B. Noel Kivlin

(57) ABSTRACT

An interconnecting apparatus employing a lossy power distribution network to reduce power plane resonances. In one embodiment, a printed circuit board includes a lossy power distribution network formed by a pair of parallel planar conductors separated by a dielectric layer.

8 Claims, 16 Drawing Sheets

U.S. PATENT DOCUMENTS

| | | | | |
|---|---|---|---|---|
| 5,162,977 | A | | 11/1992 | Paurus et al. |
| 5,261,153 | A | | 11/1993 | Lucas |
| 5,375,042 | A | * | 12/1994 | Arima et al. ............... 361/784 |
| 5,381,306 | A | * | 1/1995 | Schumacher et al. ....... 361/792 |
| 5,428,506 | A | | 6/1995 | Brown et al. |
| 5,509,200 | A | | 4/1996 | Frankeny et al. |
| 5,574,630 | A | * | 11/1996 | Kresge et al. ............... 361/792 |
| 5,800,575 | A | | 9/1998 | Lucas |
| 5,847,936 | A | | 12/1998 | Forehand et al. |
| 5,856,636 | A | * | 1/1999 | Sanso ......................... 174/255 |
| 5,870,274 | A | | 2/1999 | Lucas |
| 5,936,843 | A | * | 8/1999 | Ohshima et al. ............ 361/760 |
| 6,075,211 | A | | 6/2000 | Tohya et al. |
| 6,104,258 | A | | 8/2000 | Novak |
| 6,132,853 | A | * | 10/2000 | Noddin ....................... 428/209 |
| 6,165,596 | A | | 12/2000 | Chen et al. |
| 6,184,477 | B1 | | 2/2001 | Tanahashi |
| 6,191,475 | B1 | | 2/2001 | Skinner et al. |
| 6,212,078 | B1 | | 4/2001 | Hunt et al. |
| 6,215,373 | B1 | | 4/2001 | Novak et al. |
| 6,229,095 | B1 | * | 5/2001 | Kobayashi .................. 174/255 |
| 6,303,877 | B2 | * | 10/2001 | Moriizumi et al. ......... 174/261 |

OTHER PUBLICATIONS

Huber et al., "Time–Domain Investigation of Decoupling Capacitors on MCM," May 1999, 2 pgs.
Madou et al., "Electrical Characterisation of Capacitors Integrated in Multi–layer Printed Circuit Boards," May 1999, 2 pgs.
Pham et al., "Decoupling Capacitors Techniques for High Frequency Board Designs," Feb. 1999, pp 127–135.
Fisher et al., "The Role of Capacitors in High–Speed Systems Design," Feb. 1999, pp. 137–155.
Lipa et al., "Flip–Chip Power Distribution," © 1998 IEEE, pp. 39–41.
Wu et al., "Accurate Power Supply and Ground Plane Pair Models," © 1998 IEEE, pp. 163–166.
Moll et al., "Extraction of Equivalent Circuit Models of Package Power Supply Distribution Systems from Full Wave EM Field Simulations," © 1998 IEEE, pp. 167–170.
Fan et al., "Incorporating Vertical Discontinuities in Power–Bus Modeling using a Mixed–Potential Integra Equation and Circuit Extraction Formulation," © 1998 IEEE, pp. 171–174.
Zhao et al., "Effects of Power/Ground via Distribution on the Power/Ground Performance of C4/BGA Packages," © 1998 IEEE, pp. 177–180.
Novak, "Reducing Simultaneous Switching Noise and EMI on Ground/Power Planes by Dissipative Edge Termination," © 1998 IEEE, pp. 181–184.
Herrell et al., "Modeling of Power Distribution Systems in PCs," © 1998 IEEE, pp. 159–162.
Chen et al., "Modeling and Simulation of Thin Film Decoupling Capacitors," © 1998 IEEE, pp. 205–208.
Diaz–Alvarez et al., "Power Decoupling with Integral Capacitors and Area Array Connections," © 1998 IEEE, pp. 209–212.
Roy et al., "ESR and ESL of Ceramic Capacitor Applied to Decoupling Applications," © 1998 IEEE, pp. 213–216.
Fang et al., "Modeling of the Electrical Performance of the Power and Ground Supply for a PC Microprocessor on a Card," © 1998 IEEE, pp. 116–119.
Shi et al., "An Experimental Procedure for Characterizing Interconnects to the DC Power Bus on a Multilayer Printed Circuit Board," IEEE Transactions on Electromagnetic Compatibility, vol. 39, No. 4, Nov. 1997, pp. 279–285.
Van den Berghe et al., "Study of the Ground Bounce caused by Power Plane Resonances," IEEE Transactions on Electromagnetic Compatibility, vol. 40, No. 2, May 1998, pp. 111–119.
Moran et al., "Application of the Finite–Difference Time–Domain Method and Measurement of Split Ground Plane Structures in Mixed Signal Integrated Circuits and Packages," May 1999, 2 pgs.
Lescot et al., "Effect of a Metallic Ground Plane on Advanced CMOS On–Chip Interconnects," May 1999 2 pgs.
Novak, "Probes and Setup for Measuring Power–Plane Impedances with Vector Network Analyzer," Feb. 1999, pp. 201–214.
Daniele et al., "Spectral complete model for considering the effects of a finite ground plane on a PCB," 1996, pp. 226–229.
Leroux et al., "Modelling of Power Planes for Electrical Simulations," 1996, pp. 664–668.
Cai et al., "Numerical Extraction of Partial Inductance of Package Reference (Power/Ground) Planes," © 1995 IEEE, pp. 12–15.
Young, "Case Study of Ground Plane Inductance and Implications for Simulation,","IEEE Transactions on Components, Packaging, and Manufacturing Technology—Part B., vol. 18, No. 1, Feb. 1995, pp. 174–178.
Peng, "Theory of Wave Guiding by Two–Dimensionally Periodic Structures: Progresses and Challenges," Aug. 1999, 1 pg.
Kelly et al., "Band Diagram for a Grounded Periodic Dielectric Substrate with Square Lattice and Finite Height," Aug. 1999, 1 pg.
Yang et al., "Fundamental Artificial–Periodic Substrate Effects on Printed Circuit Antennas," Aug. 1999, 1 pg.
Tzuang et al., "Guiding and Leaky Characteristics of Microstrip above Perforated Ground Plane," Aug. 1999, 1 pg.
Amari et al., "Simple Rules for Truncation of Periodic Structures to Achieve a Prescribed Bandcap Attenuation Level," Aug. 1999, 1 pg.
International Search Report for application No. PCT/US 00/31686, mailed Mar. 22, 2001.
*Printed Circuits Handbook,* Coombs, McGraw–Hill Book Co., New York, NY, 1988, pp. 31.31, 32.1–32.21, 33.1–33.21, 34.1–34.17, and 35.5–35.15.

* cited by examiner

PRINTED CIRCUIT BOARD EMPLOYING LOSSY POWER DISTRIBUTION NETWORK TO REDUCE POWER PLANE RESONANCES

This application is a divisional application of U.S. patent application Ser. No. 09/447,513, filed Nov. 23, 1999 now U.S. Pat. No. 6,441,313.

BACKGROUND OF THE INVENTION

1. Field of the Invention

This invention relates to electronic systems, and more particularly to power distribution networks embodied within printed circuit boards and semiconductor device packages having continuous planar conductors.

2. Description of the Related Art

Electronic systems typically employ several different types of electrical interconnecting apparatus having planar layers of electrically conductive material (i.e., planar conductors) separated by dielectric layers. A portion of the conductive layers may be patterned to form electrically conductive signal lines or "traces". Conductive traces in different layers (i.e., on different levels) are typically connected using contact structures formed in openings in the dielectric layers (i.e., vias). For example, printed circuit boards typically have several layers of conductive traces separated by dielectric layers. The conductive traces are used to electrically interconnect terminals of electronic devices mounted upon the PCB. Similarly, semiconductor device packages often have several layers of conductive traces separated by dielectric layers to electronically connect bonding pads of an integrated circuit to terminals (e.g., pins or leads) of the device package.

Signals in digital electronic systems typically carry information by alternating between two voltage levels (i.e., a low voltage level and a high voltage level). A digital signal cannot transition instantaneously from the low voltage level to the high voltage level, or vice versa. The finite amount of time during which a digital signal transitions from the low voltage level to the high voltage level is called the rise time of the signal. Similarly, the finite amount of time during which a digital signal transitions from the high voltage level to the low voltage level is called the fall time of the signal.

Digital electronic systems are continually being produced which operate at higher signal frequencies (i.e., higher speeds). In order for the digital signals within such systems to remain stable for appreciable periods of time between transitions, the rise and fall times of the signals must decrease as signal frequencies increase. This decrease in signal transition times (i.e., rise and fall times) creates several problems within digital electronic systems, including signal degradation due to reflections, power supply "droop", ground "bounce", and increased electromagnetic emissions.

A signal driven upon (i.e., launched) from a source end of a conductive trace suffers degradation when a portion of the signal reflected from a load end of the trace arrives at the source end after the transition is complete (i.e., after the rise time or fall time of the signal). A portion of the signal is reflected back from the load end of the trace when the input impedance of the load does not match the characteristic impedance of the trace. When the length of a conductive trace is greater than the signal transition time (i.e., the rise or fall time) divided by about 20 times the delay per unit length along the trace, the effects of reflections upon signal integrity (i.e., transmission line effects) should be considered. If necessary, steps should be taken to minimize the degradations of signals conveyed upon the trace due to reflections. The act of altering impedances at the source or load ends of the trace in order to reduce signal reflections is referred to as "terminating" the trace. For example, the input impedance of the load may be altered to match the characteristic impedance of the trace in order to prevent signal reflection. As the transition time (i.e., the rise or fall time) of the signal decreases, so does the length of trace which must be terminated in order to reduce signal degradation.

A digital signal alternating between the high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of $\pi$ times the transition time (i.e., rise or fall time) of the signal. For example, a digital signal with a 1 nanosecond transition time has a frequency content extending up to about 318 MHz.

All conductors have a certain amount of inductance. The voltage across the inductance of a conductor is directly proportional to the rate of change of current through the conductor. At the high frequencies present in conductors carrying digital signals having short transition times, a significant voltage drop occurs across a conductor having even a small inductance. A power supply conductor connects one terminal of an electrical power supply to a power supply terminal of a device, and a ground conductor connects a ground terminal of the power supply to a ground terminal of the device. When the device generates a digital signal having short transition times, high frequency transient load currents flow in the power supply and ground conductors. Power supply droop is the term used to describe the decrease in voltage at the power supply terminal of the device due to the flow of transient load current through the inductance of the power supply conductor. Similarly, ground bounce is the term used to describe the increase in voltage at the ground terminal of the device due to the flow of transient load current through the inductance of the ground conductor. When the device generates several digital signals having short transition times simultaneously, the power supply droop and ground bounce effects are additive. Sufficient power supply droop and ground bounce can cause the device to fail to function correctly.

Power supply droop is commonly reduced by arranging power supply conductors to form a crisscross network of intersecting power supply conductors (i.e., a power supply grid). Such a grid network has a lower inductance, hence power supply droop is reduced. A continuous power supply plane may also be provided which has an even lower inductance than a grid network. Placing a "bypass" capacitor near the power supply terminal of the device is also used to reduce power supply droop. The bypass capacitor supplies a substantial amount of the transient load current, thereby reducing the amount of transient load current flowing through the power supply conductor. Ground bounce is reduced by using a low inductance ground conductor grid network, or a continuous ground plane having an even lower amount of inductance. Power supply and ground grids or planes are commonly placed in close proximity to one another in order to further reduce the inductances of the grids or planes.

Electromagnetic interference (EMI) is the term used to describe unwanted interference energies either conducted as currents or radiated as electromagnetic fields. High frequency components present within circuits producing digital signals having short transition times may be coupled into nearby electronic systems (e.g., radio and television circuits), disrupting proper operation of these systems. The United States Federal Communication Commission has established upper limits for the amounts of EMI products for sale in the United States may generate.

Signal circuits form current loops which radiate magnetic fields in a differential mode. Differential mode EMI is usually reduced by reducing the areas proscribed by the circuits and the magnitudes of the signal currents. Impedances of power and ground conductors create voltage drops along the conductors, causing the conductors to radiate electric fields in a common mode. Common mode EMI is typically reduced by reducing the impedances of the power and ground conductors. Reducing the impedances of the power and ground conductors thus reduces EMI as well as power supply droop and ground bounce.

Within the wide frequency range present within electronic systems with digital signals having short transition times, the electrical impedance between any two parallel conductive planes (e.g., adjacent power and ground planes) may vary widely. The parallel conductive planes may exhibit multiple electrical resonances, resulting in alternating high and low impedance values. Parallel conductive planes tend to radiate a significant amount of differential mode EMI at their boundaries (i.e., from their edges). The magnitude of differential mode EMI radiated from the edges of the parallel conductive planes varies with frequency and is directly proportional to the electrical impedance between the planes.

FIG. 1 is a perspective view of a pair of 10 in.×10 in. square conductive planes separated by a fiberglass-epoxy composite dielectric layer. Each conductive plane is made of copper and is 0.0014 in. (1.4 mils) thick. The fiberglass-epoxy composite layer separating the planes has a dielectric constant of 4.0 and is 0.004 in. (4 mils) thick. FIG. 2 is a graph of the magnitude of the simulated electrical impedance between the pair of rectangular conductive planes of FIG. 1 ($log_{10}$ scale) versus the frequency of a voltage between the planes ($log_{10}$ scale). The graph was created by modeling each square inch of the pair of conductive planes as a matrix of transmission line segments. The impedance value was computed by simulating the application of a 1 ampere constant current between the centers of the rectangular planes, varying the frequency of the current, and determining the magnitude of the steady state voltage between the centers of the rectangular planes.

As shown in FIG. 2, the magnitude of the electrical impedance between the parallel conductive planes of FIG. 1 varies widely at frequencies above about 20 MHz. The parallel conductive planes exhibit multiple electrical resonances at frequencies between 100 MHz and 1 GHz, resulting in alternating high and low impedance values. The parallel conductive planes of FIG. 1 tend to radiate substantial amounts of EMI at frequencies where the electrical impedance between the planes anywhere near their peripheries is high.

It would thus be desirable to provide a power distribution network wherein the electrical impedance between parallel conductive planes may be stabilized. Such a network would reduce power supply droop, ground bounce, and the amount of electromagnetic energy radiated from the edges of the planes. Such impedance stabilization may also reduce the need for bypass capacitors.

SUMMARY OF THE INVENTION

The problems outlined above are in large part solved by an interconnecting apparatus employing a lossy power distribution network to reduce power plane resonances. In one embodiment, a printed circuit board includes a lossy power distribution network formed by a pair of parallel planar conductors separated by a dielectric layer. The pair of parallel planar conductors includes a first power supply plane suitable for use, for example, as a ground plane and a second power supply plane suitable for use, for example, as a power plane (e.g., VCC). The dielectric layer has a loss tangent value of at least 0.2, and preferably of at least 0.3. In one embodiment, the dielectric material between the power planes could have a frequency dependent loss tangent, such that a loss tangent value of 0.3 is achieved at and above the lowest resonance frequency of the planes. Due to the relatively large loss tangent characteristic of the dielectric layer separating the power supply planes, the electrical impedance characteristics associated with the power planes may be stabilized, and power plane resonances may be reduced. The printed circuit board may also include one or more signal layers separated from the power planes by respective dielectric layers. The dielectric layers separating the signal layers from the power planes or other signal layers may be associated with much lower loss tangent values, such as in the range of 0–0.05. In this manner, high frequency losses associated with the signal traces may be kept relatively low.

In another embodiment, power plane resonances are suppressed by decreasing the thickness of the dielectric material between the power supply planes to less than 0.5 mils. For example, in one embodiment, the plane separation is preferably reduced to less than 0.2 mils such as, for example, 0.1 mils. In embodiments where the plane separation approaches 0.1 mils or less, plane resonances may be substantially suppressed.

In various embodiments, the power distribution network of a printed circuit board or a semiconductor package interconnect may require relatively large currents. For example, it is not uncommon for systems implemented on printed circuit boards to reach DC current requirements of 100 amps or more. Thus, relatively heavy copper or other conductor layers may be required to handle the large currents. Since a structure that includes very heavy conductive layers on a very thin dielectric layer may be associated with manufacturing and handling problems, a power distribution network may be provided within a printed circuit board or package interconnect in which numerous, relatively thin conductive layers are separated by relatively thin dielectric layers. For example, rather than employing a single pair of relatively thick (e.g., 1–2 mils) conductor layers separated by a relatively thick (e.g., 1–2 mils) dielectric layer in the power distribution network of a printed circuit board, a relatively large number of relatively thin (e.g., 0.05–0.3 mils) dielectric layers with relatively thin (e.g., 0.1–0.2 mils) conductor layers on each side. Alternating conductive layers in the stack up are connected by vias, every second of them connecting to one polarity (e.g., ground) and every other connecting to the other polarity (e.g., VCC). In this manner, the power distribution network may have a relatively low DC resistance to support relatively high currents, while attaining a relatively low high frequency impedance without resonances.

In yet another embodiment, a relatively thin conductive layer is provided between a pair of relatively thick conductive layers. A first relatively thick dielectric layer is provided between one of the thick conductive layers and the thin conductive layer, while a relatively thin dielectric layer is provided between the other relatively thick copper conductive layer and the thin conductive layer. A PCB core constructed according to this embodiment may be associated with relatively good mechanical strength and stability and may be capable of supporting relatively high currents. The structure may further be associated with a relatively low high-frequency impedance without resonances. The thin conductive layer may further be formed in a uniform pattern to create fuses which open if a short occurs through a portion of the thin dielectric.

BRIEF DESCRIPTION OF THE DRAWINGS

Other objects and advantages of the invention will become apparent upon reading the following detailed description and upon reference to the accompanying drawings in which.

Figure 1:
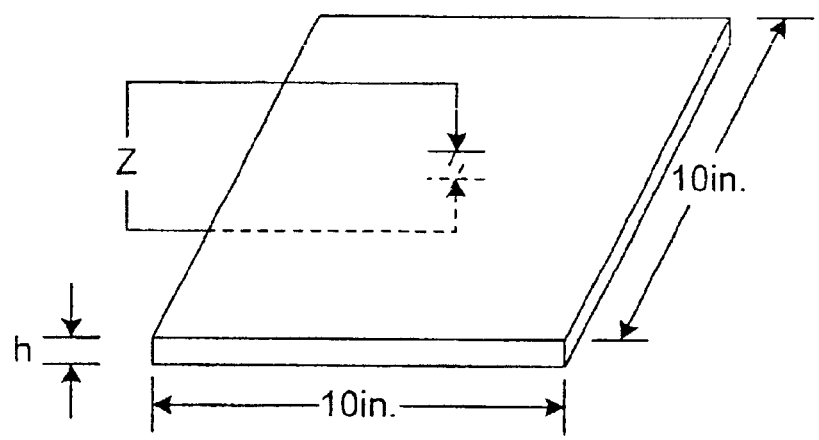
FIG. 1 is a perspective view of a pair of 10 in.×10 in. square conductive planes separated by a fiberglass-epoxy composite dielectric layer.
Figure 2:
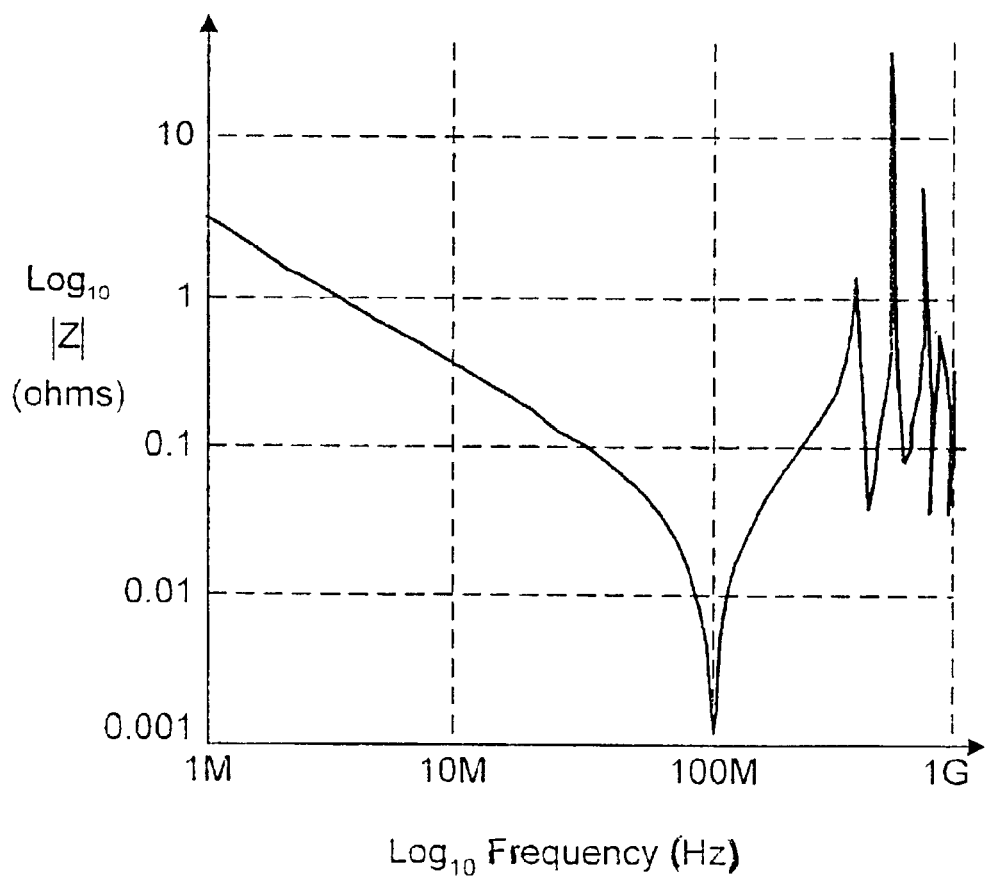
FIG. 2 is a graph of the magnitude of the simulated electrical impedance |Z| ($\log_{10}$ scale) between the pair of rectangular conductive planes of FIG. 1 versus the frequency of a voltage ($\log_{10}$ scale) between the planes.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
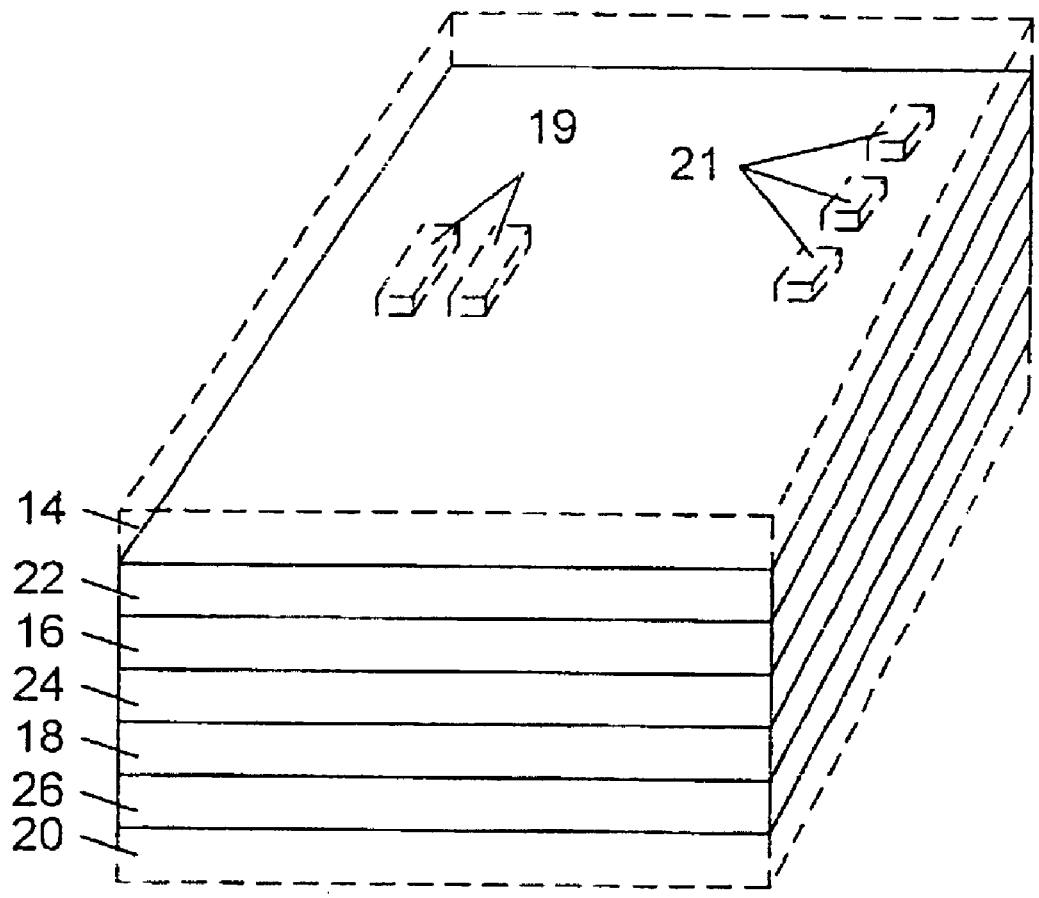
FIG. 3 is a perspective view of one embodiment of an electrical interconnecting apparatus including a set of planar electrical conductors separated by dielectric layers.

FIG. 3 is a perspective view of one embodiment of an electrical interconnecting apparatus 10 including a set of planar electrical conductors illustrated by a first signal plane 14, a ground plane 16, a power plane 18, and a second signal plane 20. Additional layers (e.g., additional signal layers) may be stacked on top of or beneath the illustrated structure, as desired. Interconnecting apparatus 10 may be, for example, a printed circuit board or an interconnect substrate of a semiconductor device package. Power plane 18 and ground plane 16 are continuous across at least a portion of interconnecting apparatus 10. First signal plane 14 and second signal plane 20 are patterned into electrically conductive traces to form signal lines that electronically connect to components or contact pads of the interconnecting apparatus. First signal plane 14 and ground plane 16 are separated by a first dielectric layer 22. Ground plane 16 and power plane 18 are separated by a second dielectric layer 24. Power plane 18 and second signal plane 20 are separated by a third dielectric layer 26.

During use of interconnecting apparatus 10, power plane 18 is connected to a power terminal of an electrical power supply, and ground plane 16 is connected to a ground terminal of the power supply. Ground plane 16 and power plane 18 are each generally referred to as a power supply plane. In embodiments where interconnecting apparatus is a printed circuit board, electronic devices 19 (illustrated in phantom) mounted on the surface of the structure and receive electrical power via ground plane 16 and power plane 18. In embodiments where interconnecting apparatus is an interconnect substrate of a semiconductor package, contact pads 21 (also shown in phantom) associated with signal layer 14 may provide electrical connection (including power) to corresponding pads of an integrated circuit contact pads (not shown) on the opposite side of the apparatus (e.g., formed as a portion of signal layer 20) may provide connection to terminals (such as BGA leads) of a device package.

It is customary to express the dielectric and conductive losses of signal traces by the following formula:

$$A^{dB} = 4.35\left(\frac{R_s}{Z_o} + G_d Z_o\right)$$

where
  A is the attenuation of the matched-terminated trace in dB,
  Rs is the series attenuation at the required frequency,
  Gd is the parallel conductance of the dielectrics at the required frequency,
  Zo is the characteristic impedance of trace.
  Rs is the total series resistance of the conductor at the frequency of interest, determined by the cross section of conductor. At higher frequencies, the resistance of conductor increases, because current tends to flow on the surface, leaving for current conduction only an effective channel of depth, which is proportional to the inverse square root of frequency. This effective depth is called the skin depth, and at a first approximation is expressed as:

$$\delta = \sqrt{\frac{1}{\pi f \sigma \mu}}$$

where
  δ is the skin depth,
  f is the frequency of interest,
  σ is the conductivity of conductor,
  μ is the permeability of mconductor.

The dielectric losses are usually expressed in terms of loss tangent, which is the ratio of conductance and capacitive reactance. From this relationship, the Gd (frequency dependent) conductance is simply GD=loss_tangent*omega*C, where omega is the radian frequency.

The loss tangent is usually a weak function of frequency, and therefore the parallel conductance increases approximately linearly with frequency.

Though the above expressions are usually valid and are applied mostly to signal traces under some further restrictive conditions, the same formulas may be applied to power-distribution planes. This approach is validated by the fact that popular simulation methods use matrices of one-dimensional transmission lines (traces) to obtain the response of two-dimensional power planes.

From the above loss equation, the required loss tangent to achieve the suppression of resonances can be calculated, for instance, by equating the low-frequency equivalent characteristic impedance of the planes (sqrt(L/C) and the inverse of the parallel loss conductance (Gd) at the lowest resonance frequency (approximately twice the inverse of the propagation delay along one side of the planes). By doing so, a required loss tangent as 1/PI~0.3 is obtained. This result is independent of the size and separation of the planes and of the dielectric constant of the material, and depends only on the ratio of inverse loss conductance and characteristic impedance (here set to one) at the specified frequency.

Figure 4A:
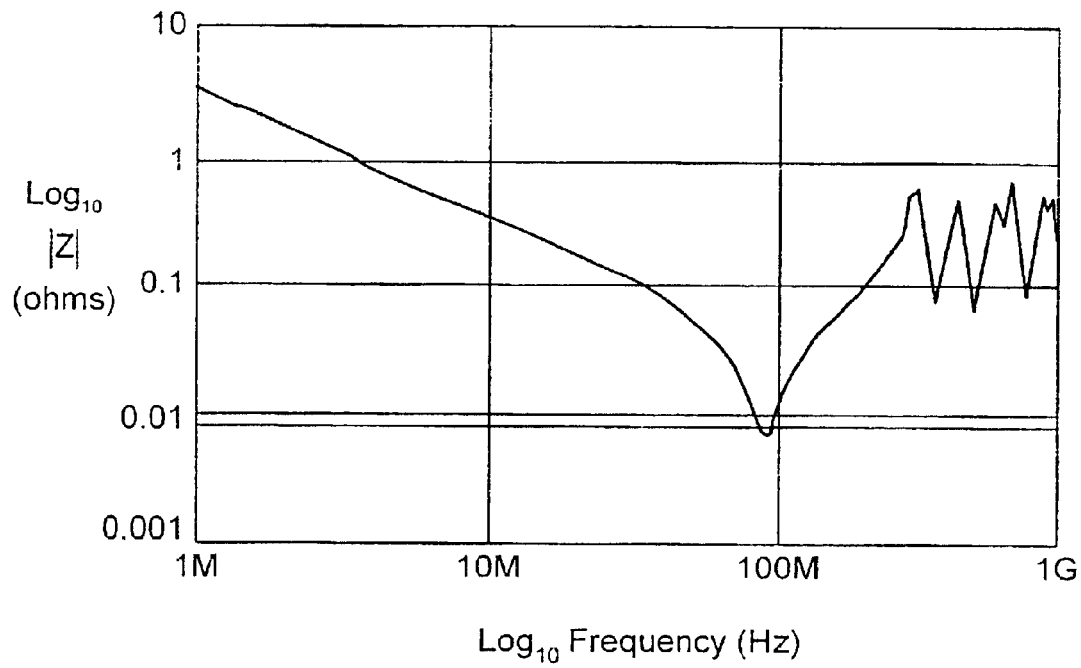
FIGS. 4A–4I are graphs illustrating the magnitude of simulated electrical impedance between the parallel conductive planes of FIG. 3 versus frequency for different loss tangent values of a dielectric layer.
Figure 4B:
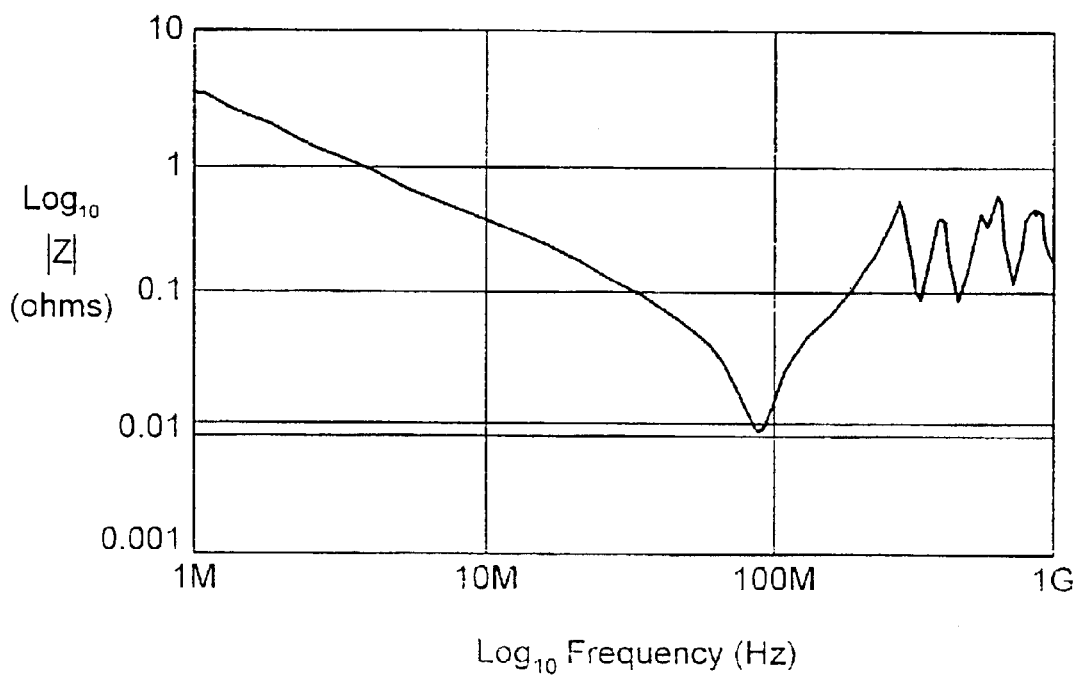
Figure 4C:
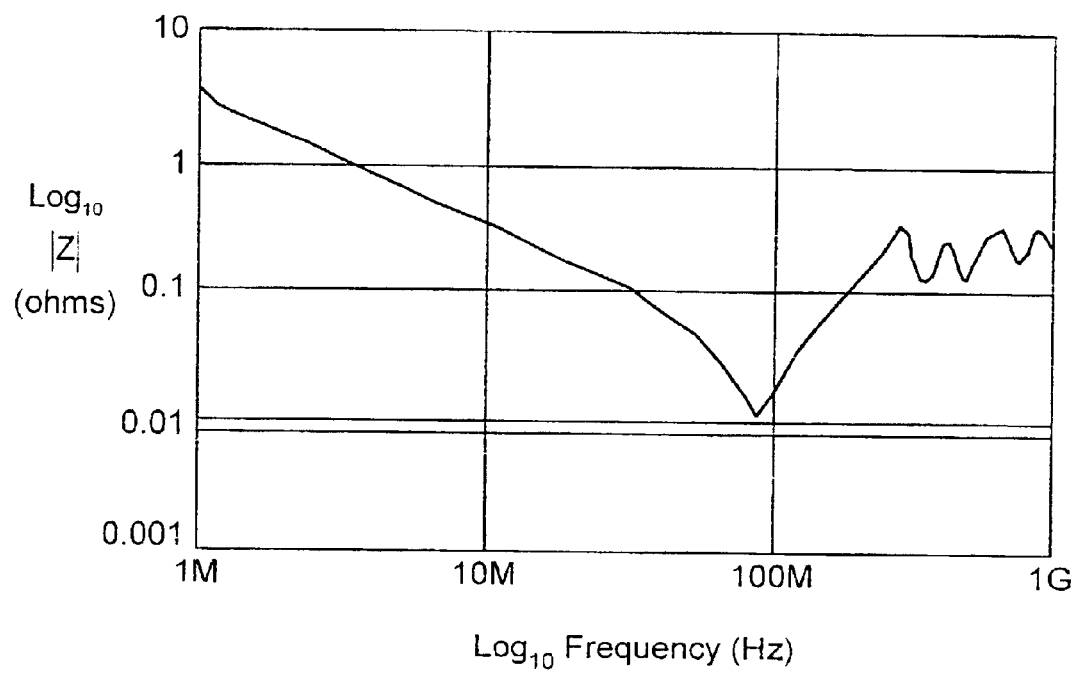
Figure 4D:
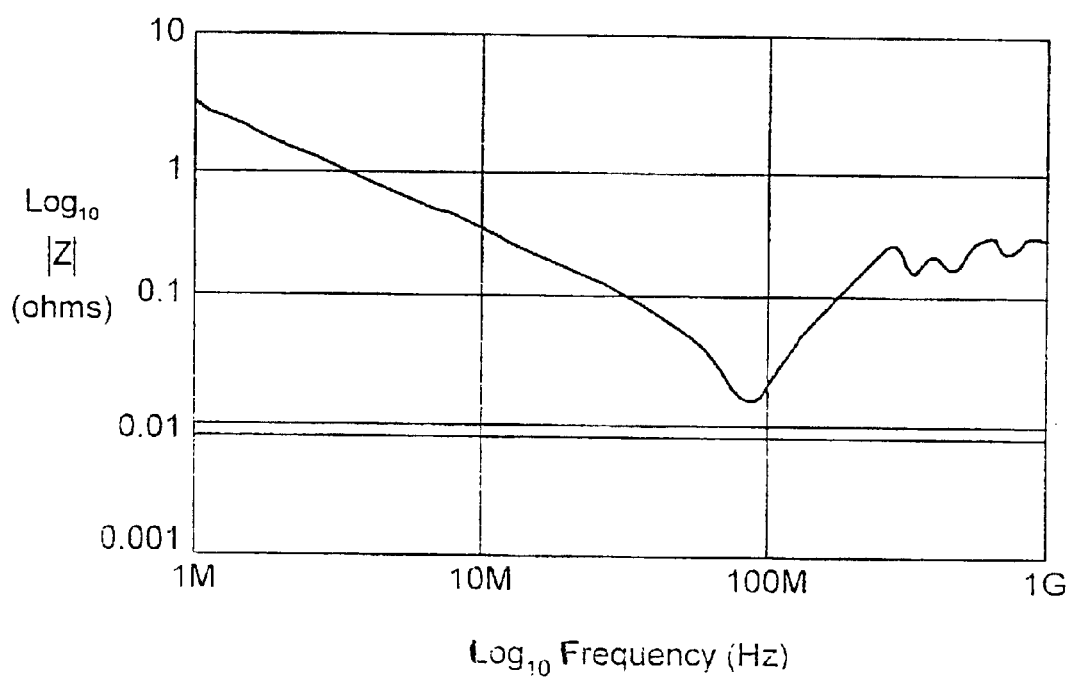
Figure 4E:
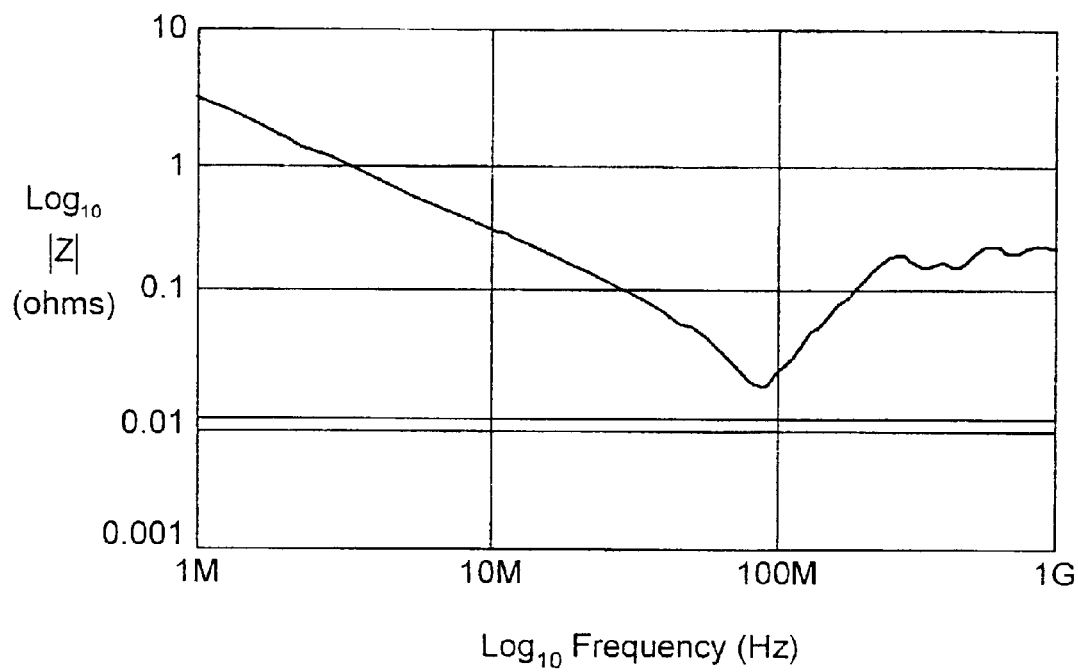
Figure 4F:
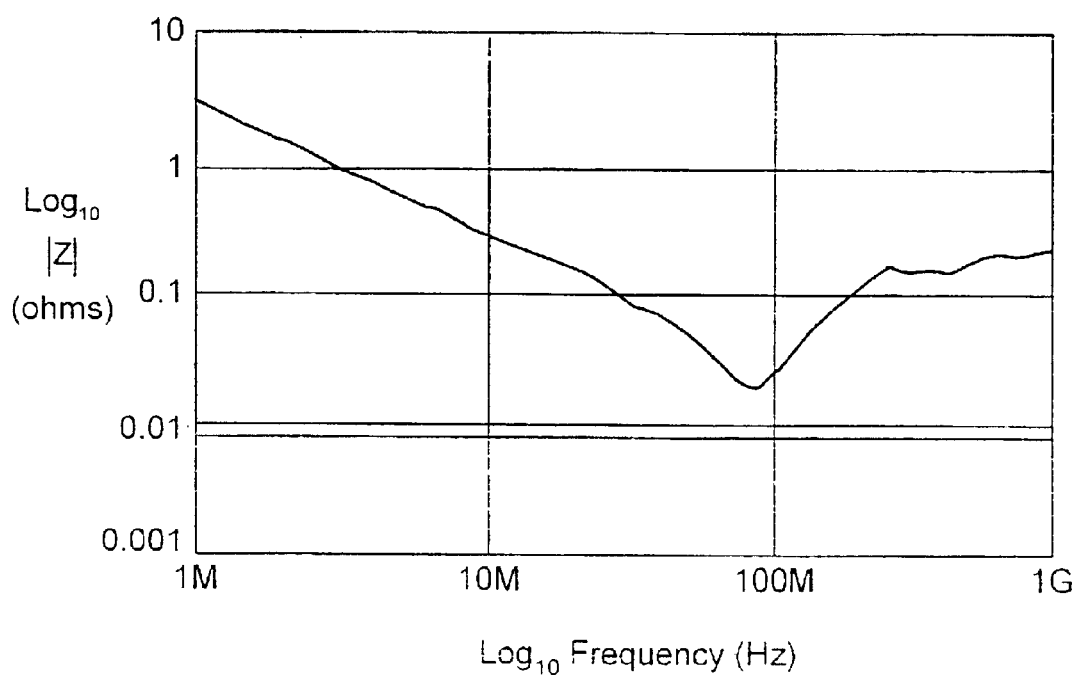
Figure 4G:
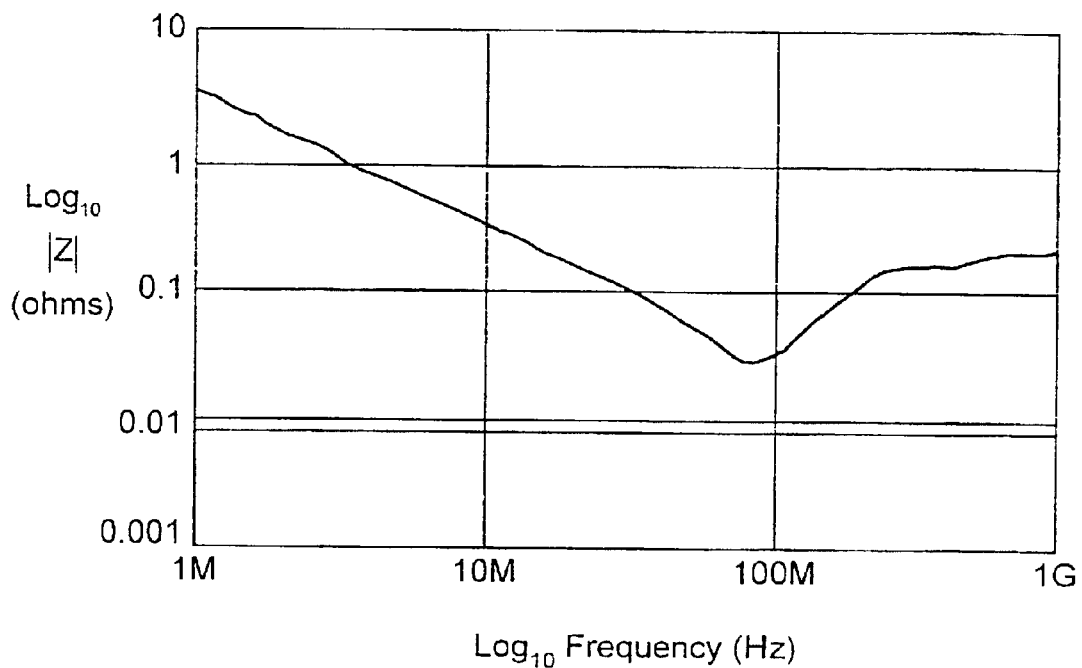
Figure 4H:
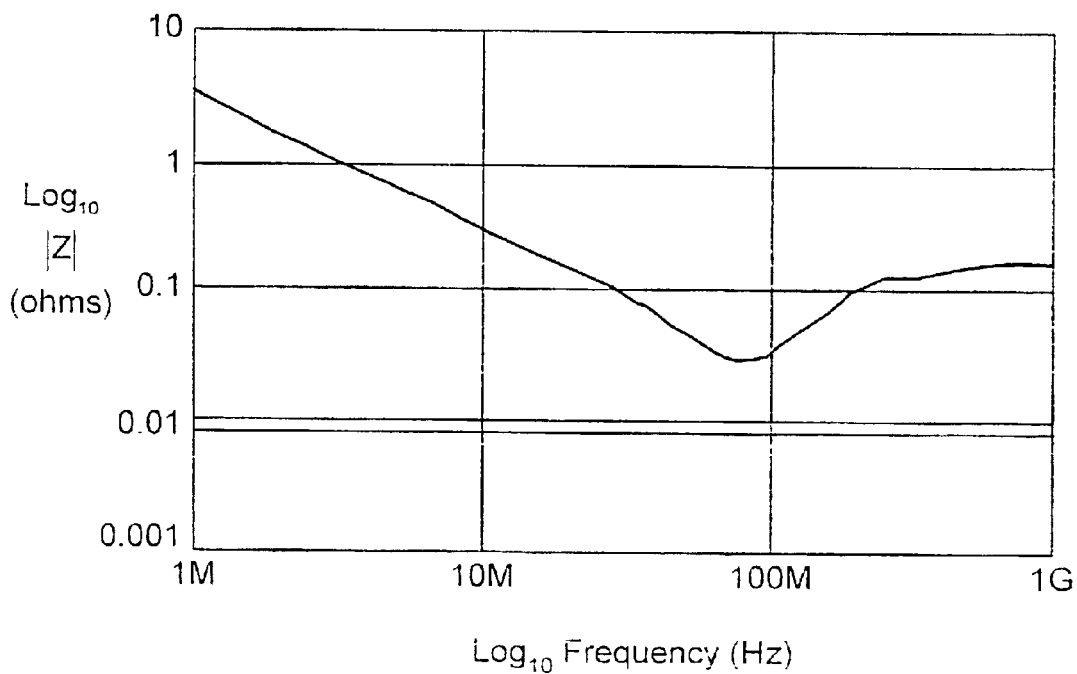
Figure 4I:
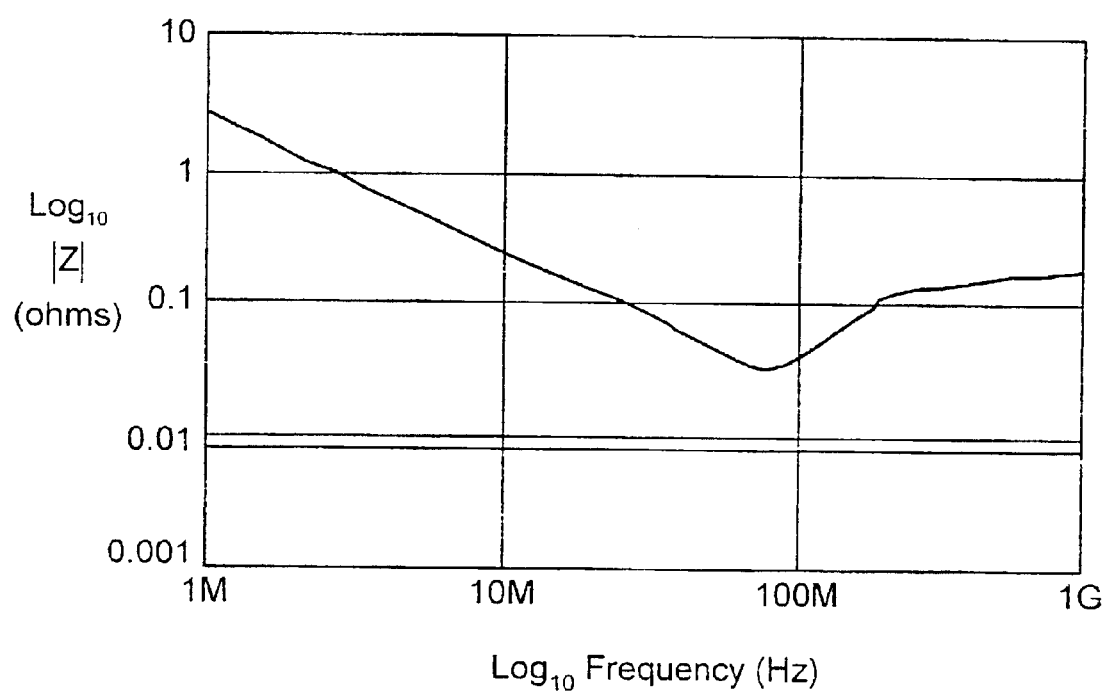

FIGS. 4A–4I are graphs illustrating the magnitude of simulated electrical impedance between the parallel conductive planes of FIG. 3 versus frequency for different loss tangent values of dielectric layer 24. The data depicted in the graphs was obtained assuming 10 inch by 10 inch square parallel planes, using 0.7-mil copper conducting planes, a lossy dielectric with a dielectric constant of 4, and 2 mils of plane separation. The impedance profiles are shown with the following dielectric loss tangent values:

0.01 (FIG. 4A)
0.03 (FIG. 4B)
0.1 (FIG. 4C)
0.2 (FIG. 4D)
0.3 (FIG. 4E)
0.4 (FIG. 4F)
0.6 (FIG. 4G)
0.8 (FIG. 4H)
1.0 (FIG. 4I).

As illustrated by FIGS. 4A–4I, the ripples in the impedance profile gradually decreases as the loss tangent reaches a value of 0.3. There is no significant further change in the impedance profile as the loss tangent increases beyond 0.3.

In accordance, in one embodiment of the electrical interconnecting apparatus illustrated by FIG. 3, the dielectric layer 24 separating ground plane 16 and power plane 18 is provided with a loss tangent of at least 0.2, and preferably of 0.3 or higher for frequencies at or above the lowest resonance frequency of the planes. In this manner, power plane resonances may be reduced, and low DC resistance may be attained.

It is noted that dielectric materials commonly used in printed circuit boards have a loss tangent typically of only a few percent (e.g., 0.02) at most. In one embodiment, to keep high frequency signal losses associated with the signal traces of first signal plane 14 and second signal plane 20 relatively low, dielectric layers 22 and 26 may be formed using such a common printed circuit board dielectric material having a relatively low loss tangent of approximately 0.01–0.02 (or generally within the range of between 0.00 and 0.05).

Figure 5A:
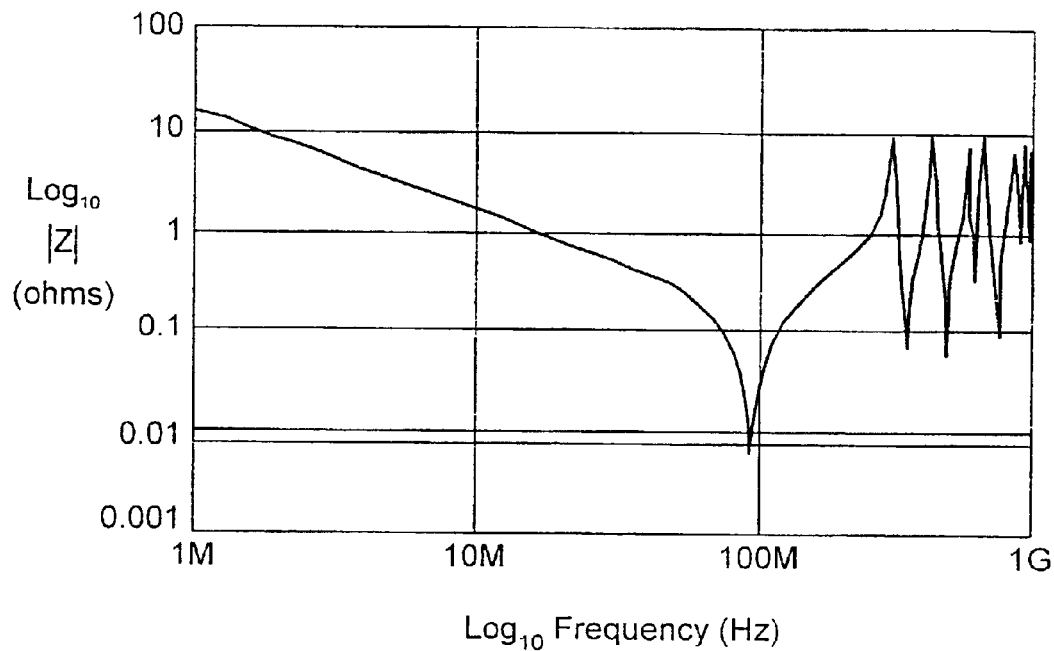
FIGS. 5A–5H are graphs of the magnitude of the simulated electrical impedance between the conductive planes of FIG. 3 versus frequency for different plane separations.
Figure 5B:
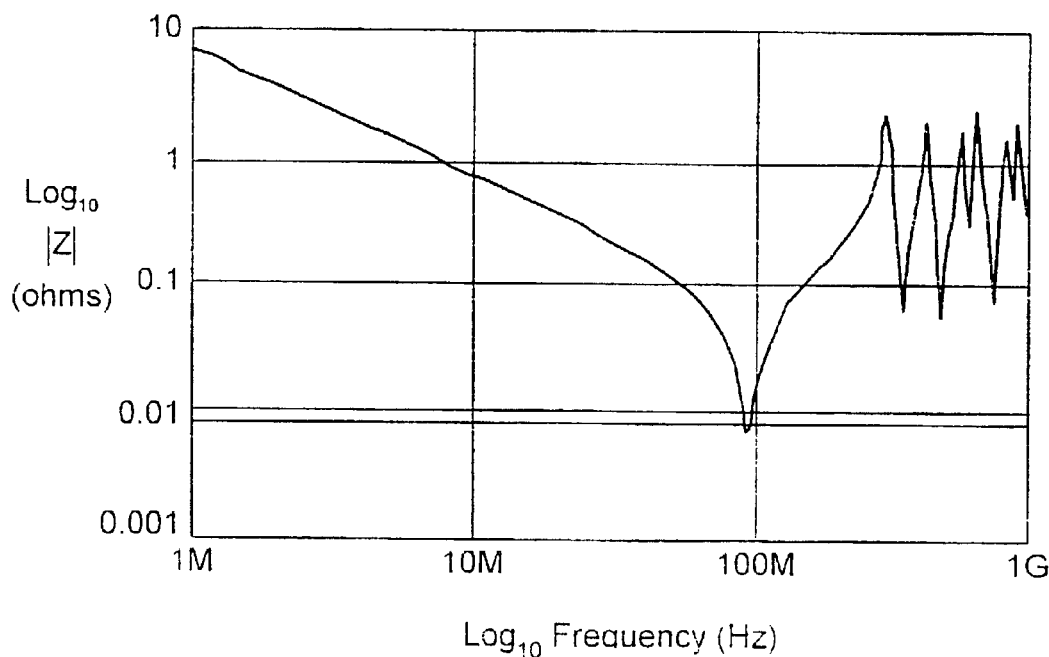
Figure 5C:
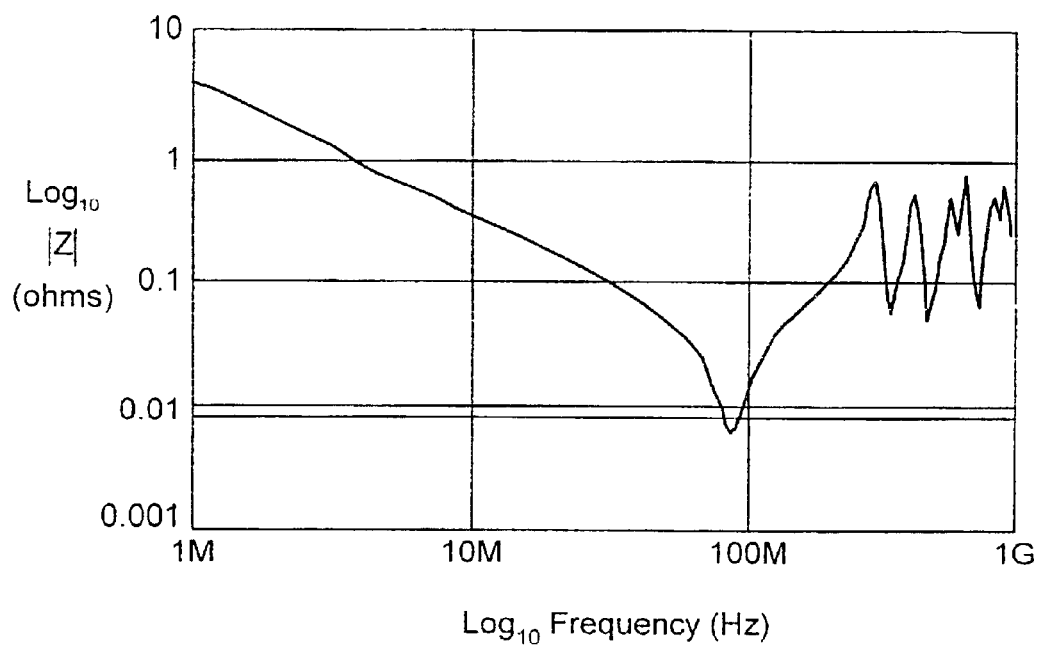
Figure 5D:
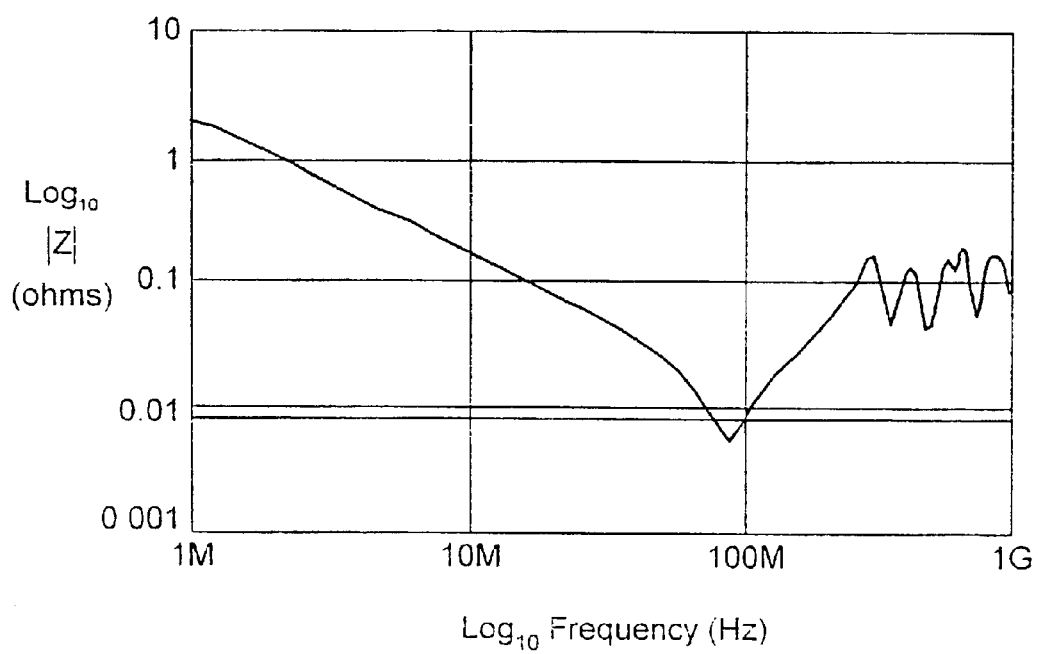
Figure 5E:
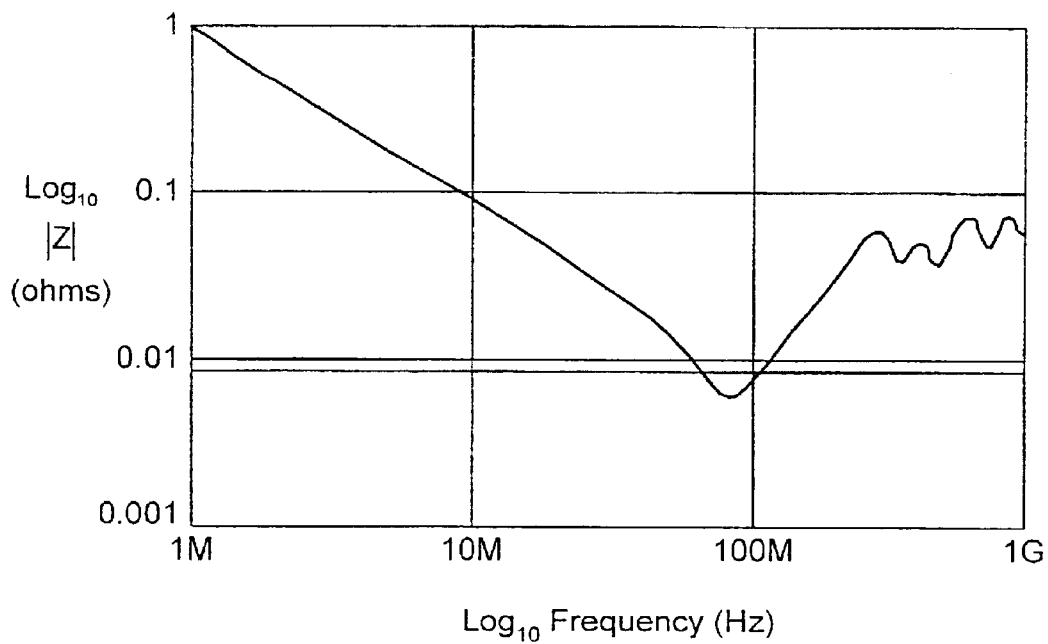
Figure 5F:
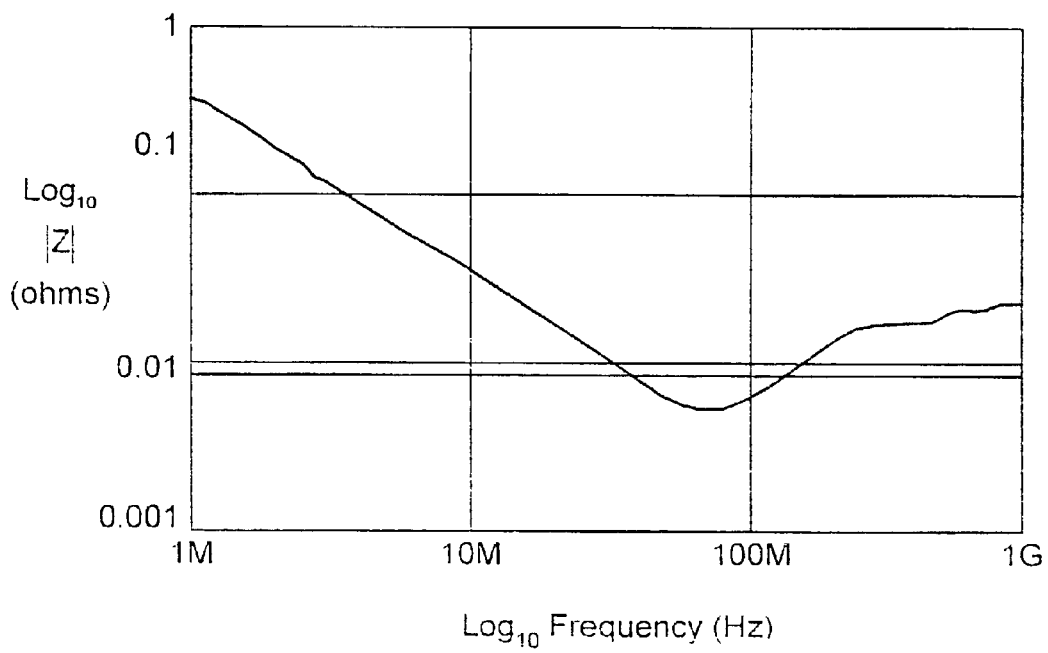
Figure 5G:
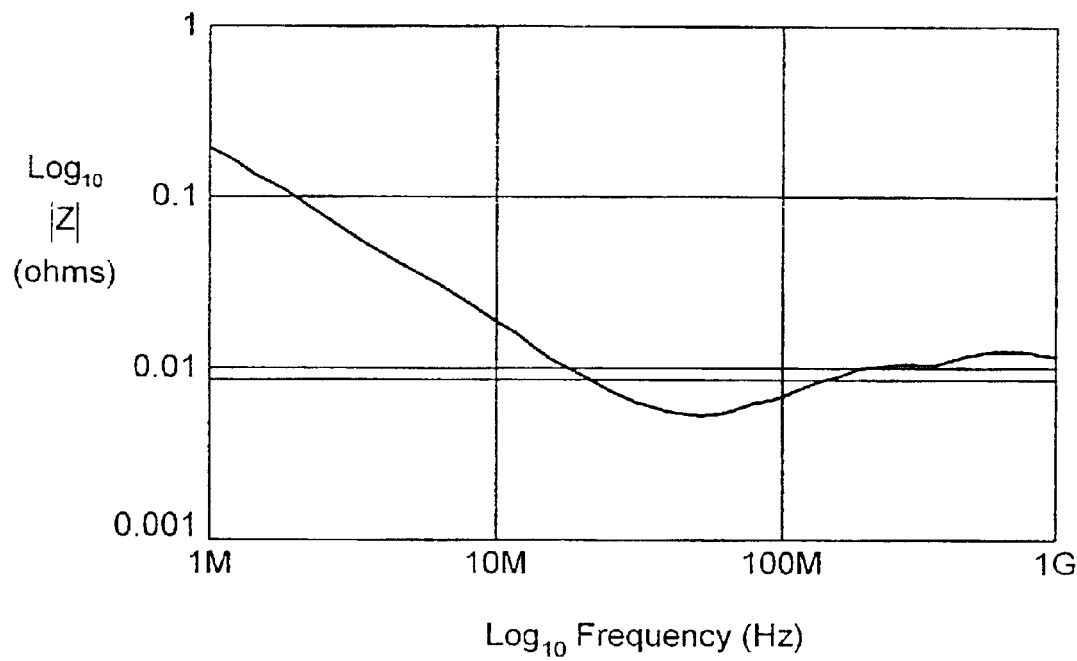
Figure 5H:
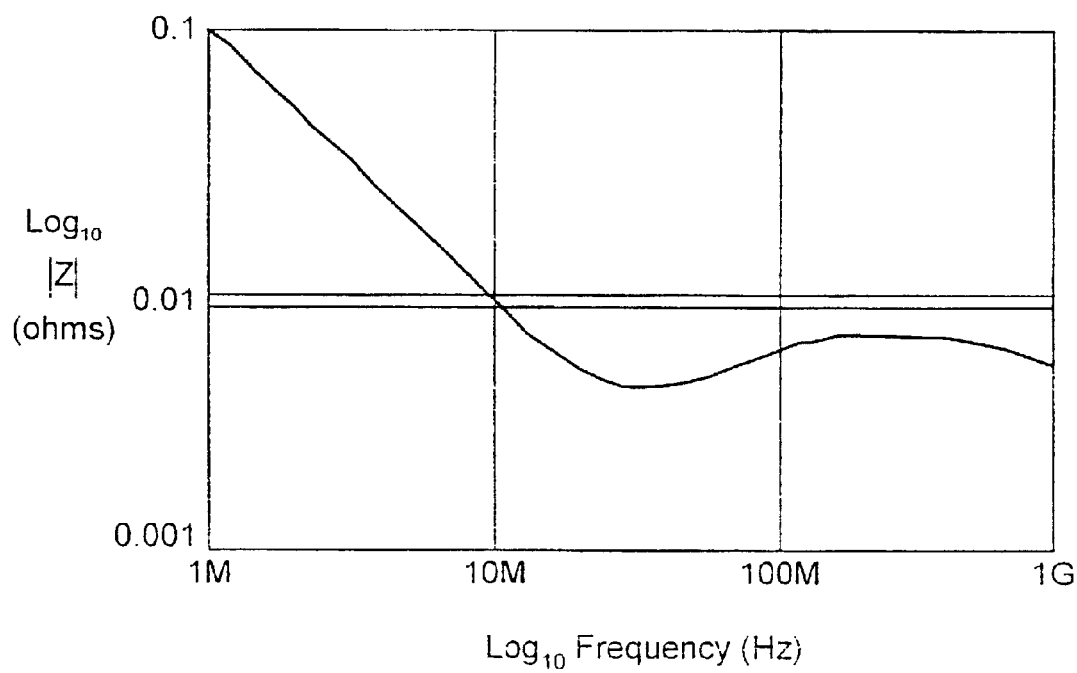

Series conductor losses may also help to suppress resonances. In general, for signal interconnects, a given series conductor loss provides higher attenuation at high frequencies if the characteristic impedance of the interconnect is low. Thus, in one embodiment, to lower the characteristic impedance, the separation between ground plane 16 and power plane 18 is reduced. FIGS. 5A–5H are graphs of the magnitude of the simulated electrical impedance between the conductive planes of FIG. 3 versus frequency for different plane separations. The profiles depicted in FIGS. 5A–5H again assume 10 inch by 10 inch square parallel planes, with 0.7-mil copper and a lossless dielectric having a dielectric constant of 4. The impedance profiles are depicted for the following dielectric thicknesses:

10 mils (FIG. 5A)
4 mils (FIG. 5B)
2 mils (FIG. 5C)
1 mil (FIG. 5D)
0.5 mil (FIG. 5E)
0.2 mil (FIG. 5F)
0.1 mil (FIG. 5G)
0.05 mil (FIG. 5H).

It is evident from FIGS. 5A–5H that with a plane separation approaching 0.1 mil and less, the plane resonances are almost totally suppressed. It is noted that the thinnest dielectric commonly used in modern printed circuit boards is approximately 2-mils (for example, a ZBC2000 core). However, as depicted in FIG. 5C, the impedance profile associated with a 2-mils dielectric thickness exhibits relatively large resonances. Accordingly, a printed circuit board having a power distribution network as illustrated in FIG. 3 is provided where the thickness of dielectric layer 24 is at most 0.5 mil, and is preferably 0.1 mil or less.

Figure 6A:
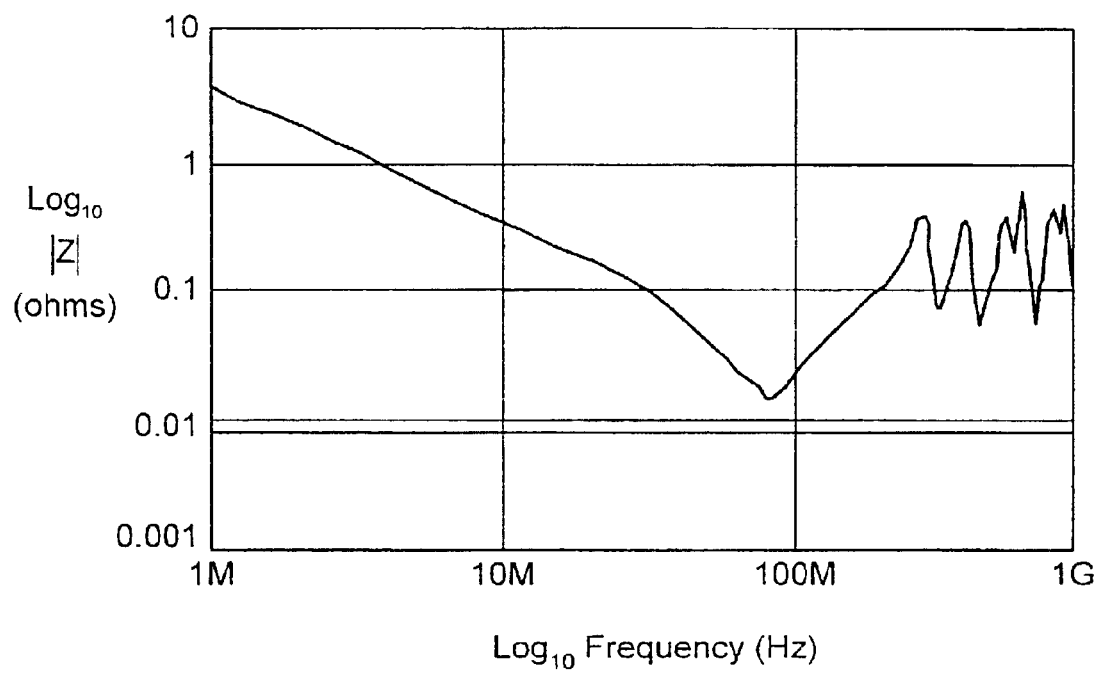
FIGS. 6A–6E are graphs of the magnitude of the simulated electrical impedance between the conductive planes of FIG. 3 versus frequency for different dielectric and conductor thickness values.
Figure 6B:
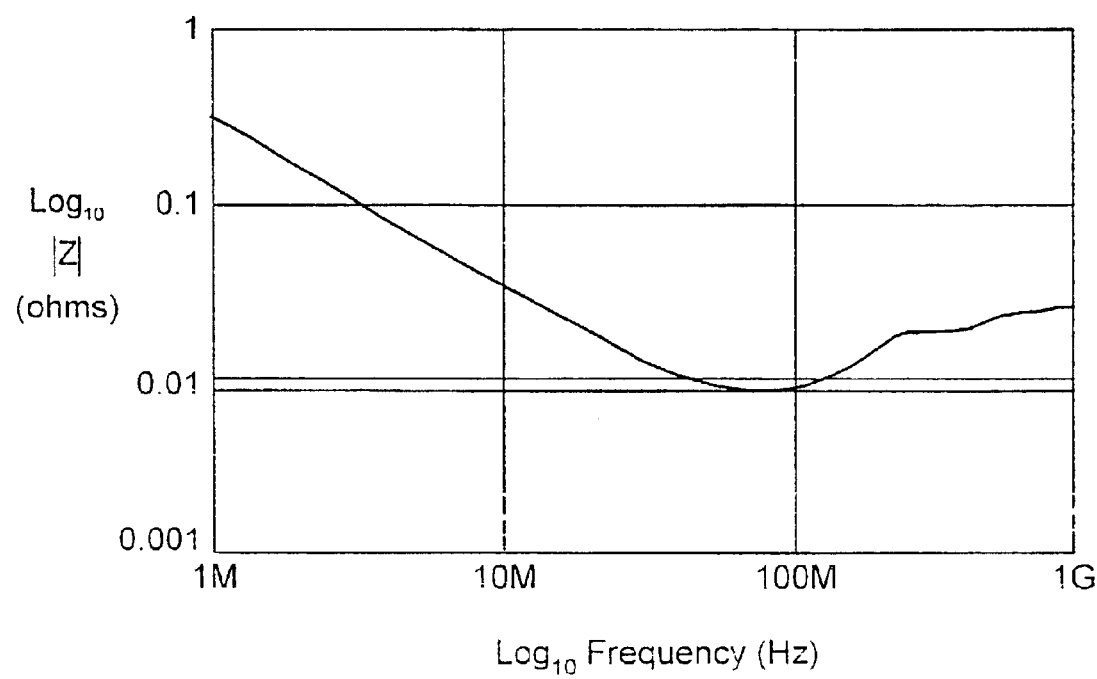
Figure 6C:
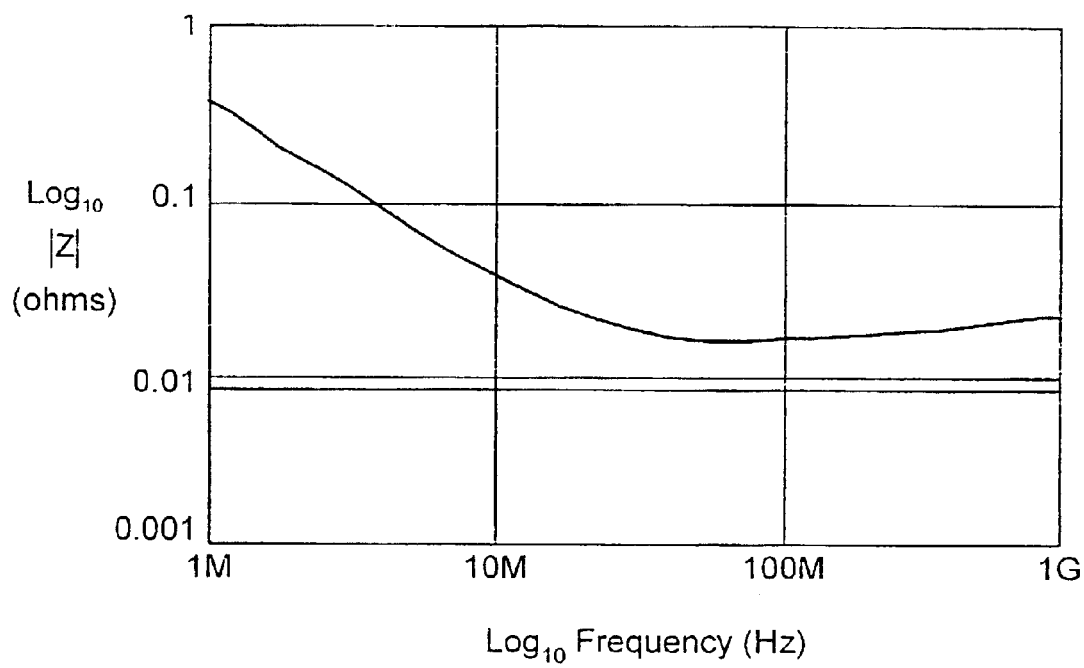
Figure 6D:
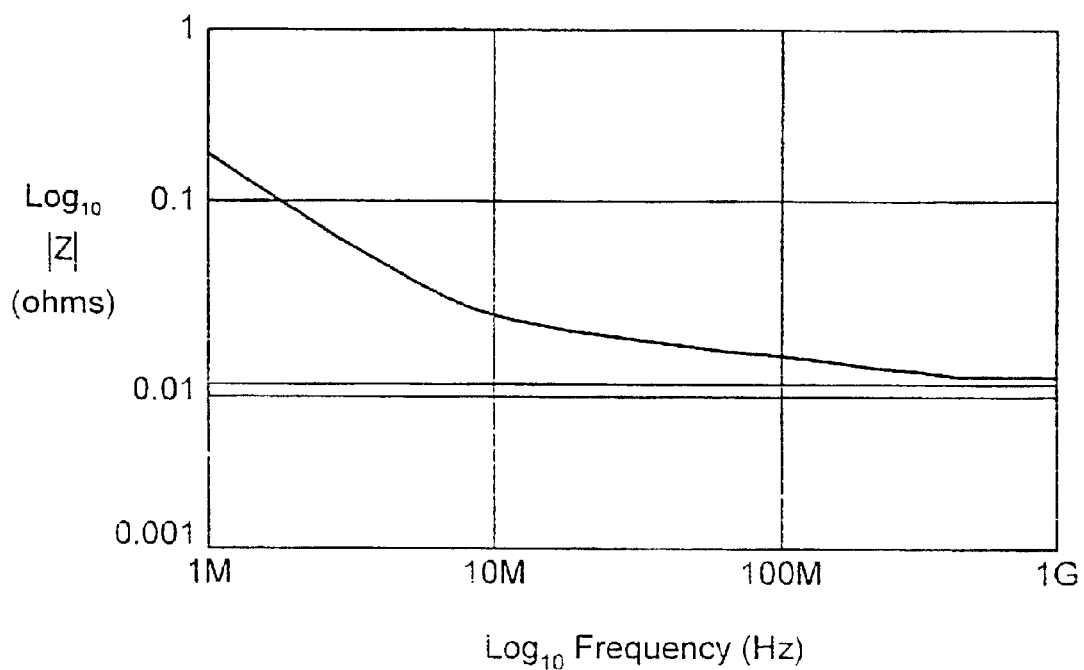
Figure 6E:
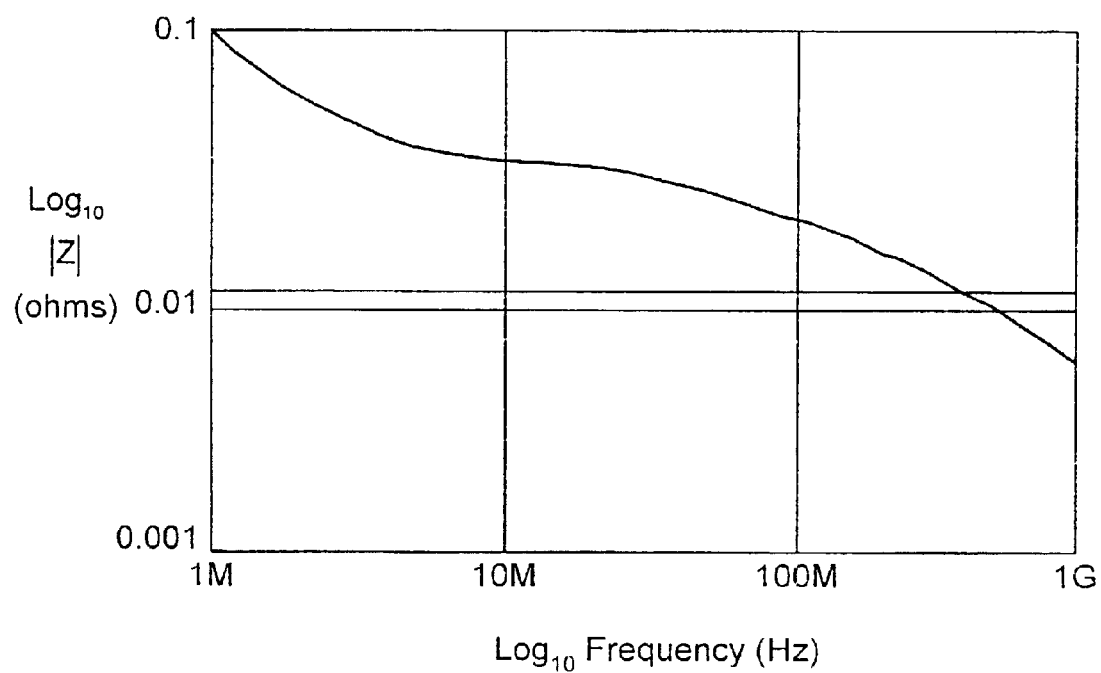

Resonances may also be suppressed by reducing the thickness of the conductive layers. FIGS. 6A–6E are graphs of the magnitude of the simulated electrical impedance between the conductive planes of FIG. 3 versus frequency for different dielectric and conductor thicknesses. The profiles depicted in FIGS. 6A–6E again assume 10 inch by 10 inch square parallel planes, with a lossless dielectric having a dielectric constant of 4. The impedance profiles are depicted for the following dielectric and conductor thicknesses:

2 mils dielectric, 0.1 mils copper (FIG. 6A)
0.2 mils dielectric, 0.2 mils copper (FIG. 6B)
0.2 mils dielectric, 0.1 mils copper (FIG. 6C)
0.1 mils dielectric, 0.1 mils copper (FIG. 6D)
0.05 mils dielectric, 0.05 mils copper (FIG. 6E).

Figure 7:
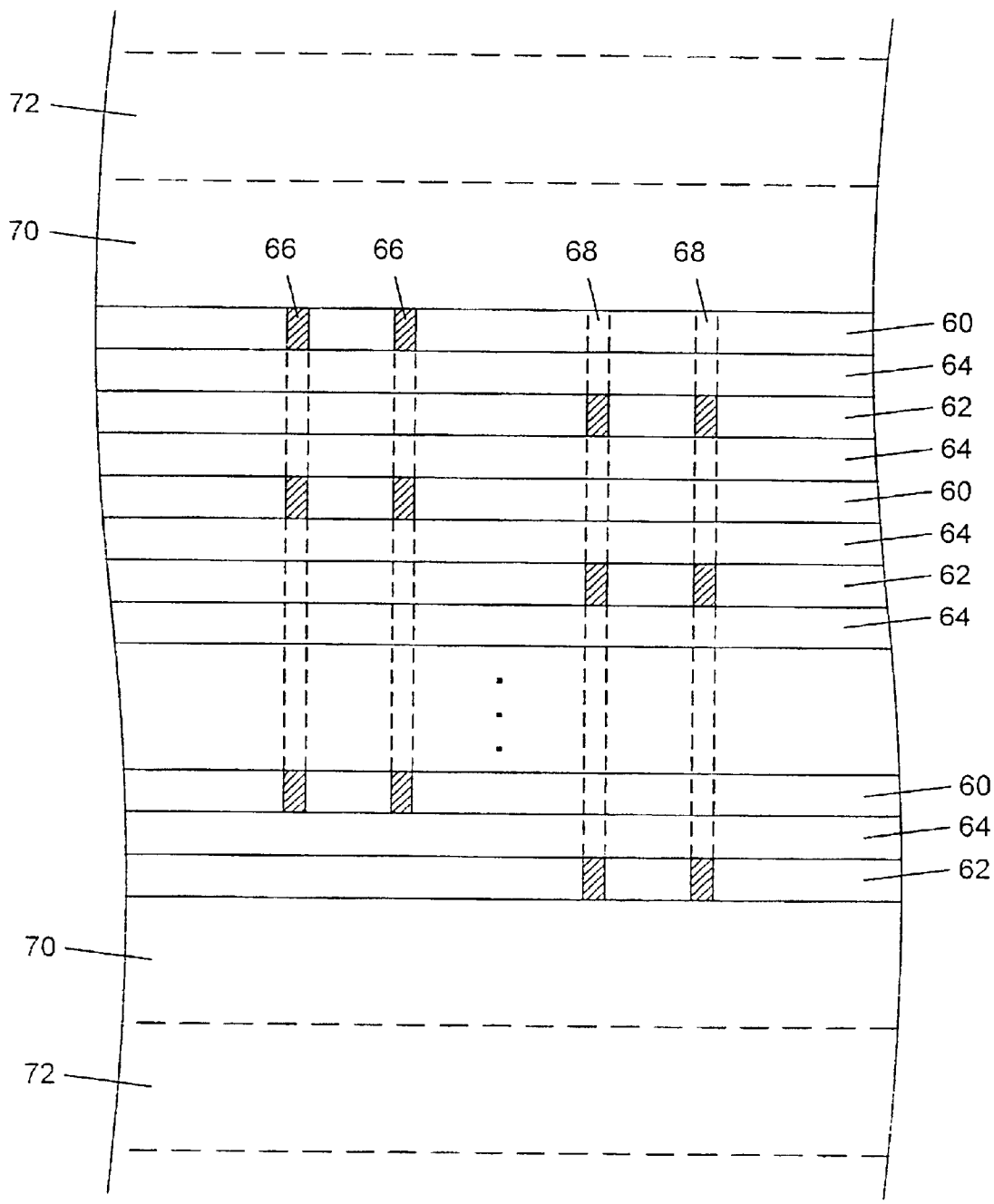
FIG. 7 is a cross-sectional view of another embodiment of a power distribution network employing numerous parallel power and ground planes.

It is noted that the amount of required copper (or other conductor) in the planes may be dictated by the DC current requirements. With system currents reaching 100 amps or more, sometimes greater than one ounce of copper (approximately 1.2 mils) may be required to guarantee good power distribution. The use of very heavy copper or conductor layers on very thin dielectrics, however, may create manufacturing and handling problems. Thus, as illustrated in FIG. 7, in one embodiment a power distribution network formed by a single ground plane and a single power plane may be replaced by multiple thin (e.g., 0.2 mil or less) conductor layers in parallel each with proportionally less conductive material in each layer, and with a thin (e.g., 0.2 mil or less) dielectric layer between each conductor layer. In FIG. 7, a plurality of alternating ground planes 60 and power planes 62 are separated by respective thin dielectric layers 64. To ensure resonance suppression, the thickness of each power supply plane 60 and 62 is no more than 0.5 mil. For example, in one embodiment, each conductive layer 60 and 62 formed by copper has a thickness of 0.1 mil. Additionally, each dielectric layer 64 has a thickness of no more than 0.5 mil. The ground planes 60 are electrically interconnected by a plurality of vias 66, and the power planes 62 are electrically interconnected by a plurality of vias 68. It is noted that clearance antipads may be etched in the conductive layers at respective locations of ground planes 60 and power plane 62 to prevent shorting. More particularly, to prevent vias 66 from providing electrical connections to power planes 62, clearance antipads may be provided at appropriate locations in each power plane 62 to avoid such contact. Similar clearance antipads may be provided within ground planes 60. It is noted that additional vias (not shown) for interconnecting various signal layers may also be incorporated within the structure of FIG. 7, as desired.

FIG. 7 further illustrates additional dielectric layers 70 which separate the power distribution network (formed by the alternating ground and power planes 60 and 62) from signal layers 72. In one embodiment, the thickness of dielectric layers 70 is at least 1 mil to keep high frequency signal losses relatively low.

The power distribution network as illustrated in FIG. 7 may advantageously reduce power supply resonances while allowing for relatively high current capabilities and avoiding manufacturing and handling problems. For example, consider a situation in which a 2 mil dielectric layer with one ounce (1.2 mils) copper planes on each side is replaced with 11 parallel layers of 0.2 mil dielectric with 0.1 mil copper layers on each side. The original structure (having a 2 mil dielectric layer with one ounce [1.2 mils] copper planes on each side) has a thickness of 4.4 mils, and an impedance in the 10–1000 MHz range of 8–500 milliohms with resonance peaks and dips. A structure embodied according to FIG. 7 having eleven 0.2 mil thick dielectric layers with 0.1 mil copper on each side has approximately the same DC resistance, but its high frequency impedance in the same 10–1000 MHz range may be below 3 milliohms without resonances.

Figure 8:
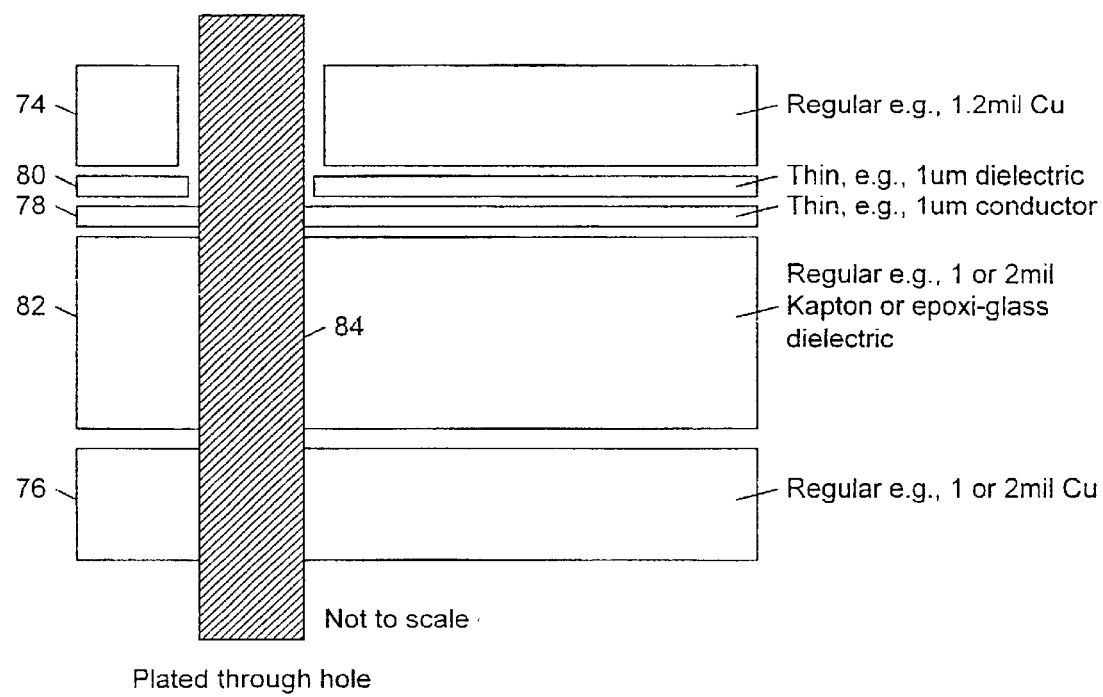
FIG. 8 is a cross-sectional view of yet another embodiment of a power distribution network employing a thin dielectric layer to reduce resonance.

Yet another embodiment is illustrated in FIG. 8. In FIG. 8, a power distribution network includes two relatively thick (e.g., each being at least 1.0 mil thick, such as 1.2 mils) conductive layers 74 and 76 to allow for relatively high DC currents. A third, relatively thin (e.g, 0.5 mil or less, such as 0.1 mil), conductive layer 78 is further provided, with a thin (e.g, 0.5 mil or less, such as 0.1 mil) dielectric layer separating conductive layers 74 and 78, and a relatively thick (e.g, at least 1 mil) dielectric layer 82 separating conductive layers 76 and 78. A via 84 electrically interconnects conductive layers 76 and 78. Conductive layers 74 and 76 in conjunction with dielectric layer 82 provides sufficient copper weight for low resistance and high current capability, and also provides for mechanical strength and protects the thin inner layers 78 and 80. The thin conductive layer 78 and dielectric layer 80 provide for low inductance and loss, efficiently suppressing plane resonances. A via 84 is provided to interconnect conductive layers 76 and 78. It is noted that the layered structure of FIG. 8 may be formed before (and independent of) the incorporation of the vias (such as via 84) which interconnect planes 76 and 78. No antipads internal to the structure need to be incorporated; only the outer layer (conductor 74) needs to be provided with an antipad (or similar isolation) to provide isolation from the vias. It is also noted that in an alternative embodiment, an additional thin (e.g., 0.5 mil or less, such as 1 um.) conductor layer and an additional thin (e.g., 0.5 mil or less, such as 1 um.) dielectric layer could be incorporated between dielectric layer 82 and conductive layer 76 to create a symmetric stack-up structure.

Figure 9:
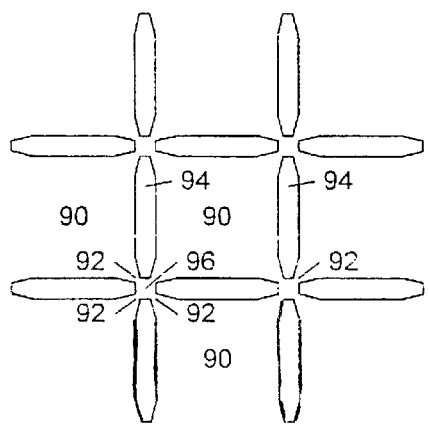
FIG. 9 is a top view of a thin conductive layer where small regions of the layer are coupled to the rest of the plane with short narrow bridges to form a fused structure.

A further advantage of the structure illustrated in FIG. 8 may be achieved by employing a "fused" construction to deal with local defects or shorts. For example, as illustrated in FIG. 9, a uniform pattern may be formed on the thin conductive layer 78, where small regions 90 of the layer are coupled to the rest of the plane with short narrow bridges 92. Slots 94 which are removed or etched away portions of the conductive layer separate regions 90. If a short occurs due to a failure or defect in the thin dielectric associated with a particular region 90, the narrow bridges act like a fuse and opens. This allows the remainder of the conductive plane 78 the plane may function properly. The shape and size of the regular pattern may have forms other than that shown in FIG. 9. For frequencies up to a few GHz, a slot dimension of approximately 100 mils long and 5 mils wide with a 5 mil gap between adjacent slots may be sufficient. Embodiments employing such a fused structure may require dielectric materials which will not carbonize or create conductive particles upon arching.

While the present invention has been described with reference to particular embodiments, it will be understood that the embodiments are illustrative and that the invention scope is not so limited. Any variations, modifications, additions and improvements to the embodiments described are possible. These variations, modifications, additions and improvements may fall within the scope of the invention as detailed within the following claims.

What is claimed is:

1. A printed circuit board comprising:
    a first conductive layer forming a first power supply plane;
    a second conductive layer forming a second power supply plane;
        a first dielectric layer adjacent to and separating the first and second conductive layers;
    a second dielectric layer adjacent to said second conductive layer;
        a third conductive layer forming a third power supply plane, wherein the third conductive layer is adjacent to said second dielectric layer;
        a fourth conductive layer forming a fourth power supply plane;
        a third dielectric layer adjacent to and separating the third and fourth conductive layers;
    wherein at least one of the first, second, third, or fourth conductive layers includes one or more uniform patterns, wherein each of the one or more uniform patterns includes a plurality of slots, wherein the slots comprise a removed portion of conductive material, and wherein the slots are arranged such that a bridge of conductive material exists between them.

2. The printed circuit board as recited in claim 1 wherein the first dielectric layer has a thickness of no more than 0.5 mils.

3. The printed circuit board as recited in claim 2 wherein the first conductive layer has a thickness of no more than 0.5 mils.

4. The printed circuit board as recited in claim 3 wherein the second conductive layer, the second dielectric layer, the third conductive layer, the fourth conductive layer, and the third dielectric layer each have a thickness of no more than 0.5 mils.

5. The printed circuit board as recited in claim 1 wherein the first conductive layer, the second conductive layer, the third conductive layer, the fourth conductive layer, the first dielectric layer, the second dielectric layer, and the third dielectric layer each have a thickness of no more than 0.2 mils.

6. The printed circuit board as recited in claim 1 further comprising a via which electrically interconnects the first conductive layer and the third conductive layer.

7. The printed circuit board as recited in claim 6 further comprising a second via which electrically interconnects the second conductive layer and the fourth conductive layer.

8. The printed circuit board as recited in claim 1, wherein the first dielectric layer has a loss tangent value of at least 0.2 for frequencies at or above a lowest resonance frequency of the first and second power supply planes.

* * * * *